United States Patent
Pan et al.

(10) Patent No.: US 11,887,983 B2
(45) Date of Patent: Jan. 30, 2024

(54) CAPACITOR INTEGRATED IN FINFET DEVICE AND METHOD FOR FABRICATING THE SAME

(71) Applicant: SHANGHAI HUALI INTEGRATED CIRCUIT CORPORATION, Shanghai (CN)

(72) Inventors: Rui Pan, Shanghai (CN); Jionghan Ye, Shanghai (CN)

(73) Assignee: SHANGHAI HUALI INTEGRATED CIRCUIT CORPORATION, Shanghai (CN)

(*) Notice: Subject to any disclaimer, the term of this patent is extended or adjusted under 35 U.S.C. 154(b) by 225 days.

(21) Appl. No.: 17/520,527

(22) Filed: Nov. 5, 2021

(65) Prior Publication Data

US 2022/0246604 A1   Aug. 4, 2022

(30) Foreign Application Priority Data

Feb. 4, 2021   (CN) .......................... 202110153109.9

(51) Int. Cl.

| | |
|---|---|
| *H01L 29/76* | (2006.01) |
| *H01L 29/94* | (2006.01) |
| *H01L 27/06* | (2006.01) |
| *H01L 23/522* | (2006.01) |
| *H01L 29/66* | (2006.01) |
| *H01L 49/02* | (2006.01) |
| *H01L 29/78* | (2006.01) |

(52) U.S. Cl.
CPC ...... *H01L 27/0629* (2013.01); *H01L 23/5223* (2013.01); *H01L 23/5228* (2013.01); *H01L 28/20* (2013.01); *H01L 28/60* (2013.01); *H01L 29/66795* (2013.01); *H01L 29/7851* (2013.01)

(58) Field of Classification Search
CPC ............ H01L 27/0629; H01L 23/5223; H01L 23/5228; H01L 28/20; H01L 28/60; H01L 29/66795; H01L 29/7851; H01L 23/5226; H01L 21/823431; H01L 28/24; H01L 27/0727; H01L 21/71; H01L 29/785
USPC ........................................................ 257/296
See application file for complete search history.

(56) References Cited

U.S. PATENT DOCUMENTS 11,145,709 B2 * 10/2021 Chen ................... H01L 27/01
11,670,632 B2 *  6/2023 Yu ................... H01L 21/823878
                                                     257/379

* cited by examiner

*Primary Examiner* — Theresa T Doan
(74) *Attorney, Agent, or Firm* — Alston & Bird LLP (57) ABSTRACT

The present application discloses a capacitor integrated in a FinFET. The capacitor and a resistor are both integrated in a middle-end-of-line process layer. A resistor main body layer and a resistor cover layer of the resistor and the forming regions of the intermediate dielectric layer and the lower electrode plate of the capacitor are patterned in a lithography process applying a first photomask; a forming region of an upper electrode plate is patterned in another lithography process applying a second photomask; the lower electrode plate, the upper electrode plate and the resistor main body layer are respectively connected with a metal zeroth layer. The present application further discloses a method for fabricating a capacitor integrated in a FinFET device. The disclosed method can reduce the process cost and improve the process efficiency, as well as flexibly select the capacitance of the capacitor by the process.

9 Claims, 4 Drawing Sheets

CAPACITOR INTEGRATED IN FINFET DEVICE AND METHOD FOR FABRICATING THE SAME

CROSS-REFERENCES TO RELATED APPLICATIONS

This application claims the priority to Chinese patent application No. CN202110153109.9, filed on Feb. 4, 2021, and entitled "CAPACITOR INTEGRATED IN FINFET DEEVICE AND METHOD FOR FABRICATING THE SAME", the disclosure of which is incorporated herein by reference in entirety.

TECHNICAL FIELD

The present application relates to the manufacture field of semiconductor integrated circuits, in particular to a capacitor integrated in a FinFET device and a method for fabricating it.

BACKGROUND

Introduction of the Fin Field-Effect Transistor (FinFET) technology is a major progress in semiconductor integrated circuit manufacturing at the sub-22 nm technology node. Through the FinFET technology, a gate of the transistor can control the current between a source and a drain more effectively. However, with the reduction of the feature dimensions, the fabrication of transistors has become more difficult.

A macro circuit is a building block of an integrated circuit, resistors, capacitors and inductors are also basic circuit elements in an integrated circuit. In a FinFET device process at the 14 nm technology node, fabricating a high-resistance resistor (HiR) is usually carried out during the Middle-End-Of-Line (MEOL) process, the HiR is fabricated by depositing titanium nitride (TiN) and silicon nitride (SiN) layers, patterning them with a lithographic photomask, herein the simulation model of the photomask with an EDA tool might be the HiR 265, for example.

The capacitance C of a capacitor made of two parallel conductor plates isolated by an insulator dielectric layer is calculated by using the formula below:

$$C = \varepsilon \frac{s}{d} = \varepsilon_r \varepsilon_0 \frac{s}{d}$$

wherein s is the overlapping area of the parallel plates, d is the separating distance between the plates, $\varepsilon_0$ and $\varepsilon_r$ are dielectric constant in vacuum and relative dielectric constant of the sandwiching material.

In the existing methods, the capacitor is usually fabricated in the Back-End-Of-Line (BEOL) process, which is fabricated by sequentially depositing TiN, SiN and TiN layers, patterning with two photomasks, and herein the simulation model of the two photomasks with an EDA tool might be UBM and UTM respectively, for example.

Due to the reduction of feature dimensions, it is difficult to fabricate a large capacitor of a magnitude of picofarads (pF) in this FinFET circuit. In addition, manufacturing the capacitor with two photomasks introduces higher cost.

BRIEF SUMMARY

The present application discloses a capacitor integrated in a FinFET device, meanwhile the capacitor has a variable capacitance. The present application further discloses a method of fabricating the disclosed capacitor efficiently and cost effectively.

The capacitor integrated in the FinFET disclosed by the present application and a resistor are fabricated in a layer made during the middle-end-of-line process, and the middle-end-of-line process layer is located on a front-end-of-line process layer.

A FinFET device is fabricated in the front-end-of-line process layer (i.e. a stack). The FinFET device includes gate structures and a source region and a drain region formed on two sides of the gate structures, the front-end-of-line process layer further includes a zeroth interlayer film filled between the gate structures, and the surfaces of the gate structures are in flush with the surface of the zeroth interlayer film.

The middle-end-of-line process layer includes:

a first oxide layer covering the surfaces of the gate structures and the zeroth interlayer film, the resistor and the capacitor being formed on the surface of the first oxide layer.

The capacitor includes a lower electrode plate, an intermediate dielectric layer and an upper electrode plate, all of them are superposed sequentially.

The resistor includes a resistor main body layer and a resistor covering layer, both layers are superposed sequentially.

The lower electrode plate and the resistor main body layer are formed by etching with a first TiN layer, the intermediate dielectric layer and the resistor covering layer are formed by etching with a second dielectric layer, and forming regions of the resistor and the intermediate dielectric layer and the lower electrode plate of the capacitor are defined by a first photomask.

The upper electrode plate is formed by etching with a second TiN layer, and a forming region of the upper electrode plate is defined by a second photomask; the coverage area of the upper electrode plate is smaller than the coverage area of the lower electrode plate.

The first interlayer film covers the surface of the first oxide layer formed with the capacitor and the resistor.

A patterned metal zeroth layer is formed in the first interlayer film, and the lower electrode plate, the upper electrode plate and two ends of the resistor main body layer are respectively connected with a metal zeroth main layer (MOP) of the metal zeroth layer at the top.

As a further improvement, the process node of the FinFET is 14 nm and beyond.

As a further improvement, the first oxide layer is plasma enhanced silicon oxide (PEOX).

As a further improvement, the second dielectric layer is silicon nitride.

As a further improvement, the order of magnitude of the capacitance value of the capacitor is pF.

As a further improvement, the gate structure includes a gate dielectric layer, a work function layer and a metal gate, and the gate dielectric layer includes a high-dielectric-constant layer.

As a further improvement, the FinFET device includes a fin body, the source region and the drain region are formed in the fin body on the two sides of the gate structure, and the gate structure covers a top surface and two side surfaces of the fin body between the source region and the drain region.

In order to solve the technical problem, the method for fabricating the capacitor integrated in the FinFET provided by the present application includes the following steps:

step 1: providing a semiconductor substrate which has completed a front-end-of-line process, a formed front-end-of-line process layer including a FinFET device, the FinFET device including gate structures and a source region and a drain region formed on two sides of the gate structures, the front-end-of-line process layer further including a zeroth interlayer film filled between the gate structures, the surfaces of the gate structures being in flush with the surface of the zeroth interlayer film;

step 2: performing a middle-end-of-line process and forming a capacitor and a resistor in the middle-end-of-line process layer, the middle-end-of-line process including the following sub-steps:

step 2-1: forming a first oxide layer covering the surfaces of the gate structures and the zeroth interlayer film;

step 2-2: sequentially forming a first TiN layer and a second dielectric layer on the surface of the first oxide layer;

step 2-3: performing definition by adopting a first photomask to form a first mask, the first mask covering forming regions of the capacitor and the resistor and opening regions except the forming regions of the capacitor and the resistor;

step 2-4: sequentially etching the second dielectric layer and the first TiN layer; in the forming region of the capacitor, the etched first TiN layer forming a lower electrode plate and the etched second dielectric layer forming an intermediate dielectric layer; in the forming region of the resistor, the etched first TiN layer forming a resistor main body layer and the etched second dielectric layer forming a resistor covering layer;

step 2-5: forming a second TiN layer;

step 2-6: performing definition by adopting a second photomask to form a second mask, the second mask covering a forming region of the upper electrode plate of the capacitor and opening regions except the forming region of the upper electrode plate;

step 2-7: etching the second TiN layer to form the upper electrode plate, the coverage area of the upper electrode plate being smaller than the coverage area of the lower electrode plate;

step 2-8: forming a first interlayer film, the first interlayer film covering the surface of the first oxide layer formed with the capacitor and the resistor;

step 2-9: forming a patterned metal zeroth layer in the first interlayer film, the lower electrode plate, the upper electrode plate and two ends of the resistor main body layer being respectively connected with a metal zeroth main layer of the metal zeroth layer at the top.

As a further improvement, the process node of the FinFET is less than 14 nm.

As a further improvement, the first oxide layer is plasma enhanced silicon oxide formed by adopting a plasma enhanced chemical vapor deposition process.

As a further improvement, the second dielectric layer is silicon nitride.

As a further improvement, the order of magnitude of the capacitance value of the capacitor is pF.

As a further improvement, the gate structure includes a gate dielectric layer, a work function layer and a metal gate, and the gate dielectric layer includes a high-dielectric-constant layer.

As a further improvement, the FinFET device includes a fin body, the source region and the drain region are formed in the fin body on the two sides of the gate structure, and the gate structure covers a top surface and two side surfaces of the fin body between the source region and the drain region.

As a further improvement, in step 2-2, the capacitance value of the capacitor is adjusted by adjusting the deposition thickness of the second dielectric layer.

As a further improvement, in step 2-2, after step 2-1 and before forming the first TiN layer, the method further includes a step of etching the surface of the first oxide layer, the effective contact area of the lower electrode plate being changed by changing the etching depth of the first oxide layer, and thereby the capacitance value of the capacitor being changed.

Different from the current technique in which the capacitor is provided in the back-end-of-line process layer and the resistor is provided in the middle-end-of-line process layer, the present application integrates the capacitor integrated in the FinFET and the resistor into the middle-end-of-line process layer, and configures the double-layer structure of the resistor, i.e., the resistor main body layer and the resistor covering layer, and the bottom double-layer structure of the capacitor, i.e., the lower electrode plate and the middle dielectric layer, to be the same, such that the bottom double-layer structure of the capacitor and the double-layer structure of the resistor can be defined by adopting the same photomask followed by the same etching process, so the present application can save one of the two photomasks, thus reducing the process cost and improving the process efficiency.

In addition, the capacitor in the present application is placed in the middle-end-of-line process layer, and is conducive to the connection of the metal zeroth main layer of the metal zeroth layer of the middle-end-of-line process layer to realize the leading-out of the electrode, which is conducive to increasing the capacitance value and changing the capacitance value easily when the technical node is reduced, so as to realize a variable capacitor.

BRIEF DESCRIPTION OF THE DRAWINGS

The present application will be further described below in detail in combination with the embodiments with reference to the drawings.

DETAILED DESCRIPTION OF THE APPLICATION

Figure 1:
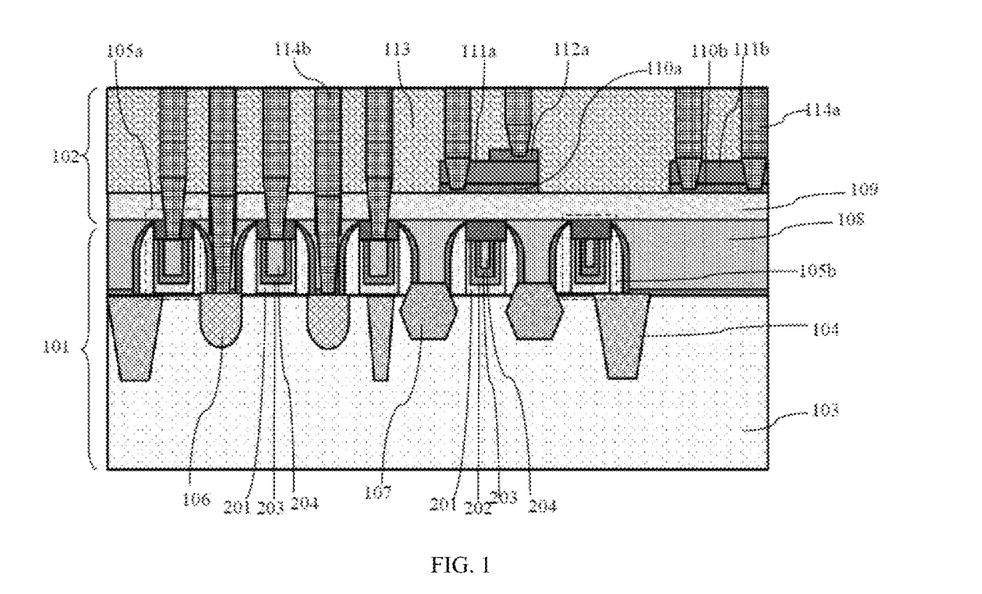
FIG. 1 is a schematic structural view of a capacitor integrated in a FinFET device according to embodiment 1 of the present application.

Referring to FIG. 1, it is a schematic structural view of a capacitor integrated in a FinFET according to embodiment 1 of the present application. The capacitor integrated in the FinFET and a resistor are integrated in a middle-end-of-line process layer (a stack, being called a layer for simplicity) 102, wherein the middle-end-of-line process layer 102 is disposed on top of a front-end-of-line process layer 101, according to embodiment 1 of the present application.

A FinFET device is built in the front-end-of-line process layer 101, the FinFET device includes gate structures and a source region and a drain region formed on two sides of the gate structures, the front-end-of-line process layer 101 further includes a zeroth interlayer film 108 filling between the gate structures, and the top surfaces of the gate structures are in flush with the top surface of the zeroth interlayer film 108.

The middle-end-of-line process layer 102 includes:
a first oxide layer 109 which is disposed on the top surfaces of the gate structures and the top surface of the zeroth interlayer film 108, and the resistor (110), wherein the capacitor is formed on the surface of the first oxide layer 109.

In the embodiment 1 of the present application, the first oxide layer 109 is silicon oxide disposed by plasma enhanced deposition.

The capacitor includes a lower electrode plate 110a, an intermediate dielectric layer 111a and an upper electrode plate 112a, the three layers are at least partially superposed in sequence.

The resistor includes a resistor main body layer 110b and a resistor cover layer 111b, both layers are superposed sequentially.

The lower electrode plate 110a and the resistor main body layer 110b are formed by an etching process step on a first TiN layer including 110a and 110b, the intermediate dielectric layer 111a and the resistor cover layer 111b are formed by etching on a second dielectric layer 111, and the first photomask defines the patterns of the resistor, the intermediate dielectric layer 111a and the lower electrode plate 110a of the capacitor.

According to the embodiment 1 of the present application, the second dielectric layer 111a, 111b are made of silicon nitride.

The upper electrode plate 112a is formed by etching on a second TiN layer, and the pattern of the upper electrode plate 112a is defined by the second photomask; the area of the upper electrode plate 112a is smaller than the area of the lower electrode plate 110a.

The first interlayer film 113 is disposed on the surface of the first oxide layer 109 which is involved in forming the capacitor and the resistor.

A patterned metal zeroth layer is formed in the first interlayer film 113, and the lower electrode plate 110a, the upper electrode plate 112a and the resistor main body layer 110b are respectively connected to the metal zeroth main layer 114a of the metal zeroth layer.

The technology process node of the FinFET is 14 nm and beyond.

The order of magnitude of the capacitance value of the capacitor is pF.

The resistor is a high-resistance resistor.

By setting the thickness of the intermediate dielectric layer 111a a to predetermined value, the capacitance value of the capacitor can be set to a desired level, such that the capacitor has a process determined flexibility.

The gate structure includes a gate dielectric layer 201, a work function layer and a metal gate 204.

The gate dielectric layer 201 includes a high-dielectric-constant material, an interface layer between the high-dielectric-constant material layer 201 and fin body 103 in the semiconductor substrate, and a bottom barrier layer on the surface of the high-dielectric-constant material layer 201.

A top barrier layer is further provided between the work function layer and the metal gate.

The material of the interface layer includes silicon oxide.

The material of the high-dielectric-constant layer includes silicon dioxide, silicon nitride, aluminum oxide, tantalum pentoxide, yttrium oxide, hafnium silicate oxide, hafnium dioxide, lanthanum oxide, zirconium oxide, strontium titanate, and zirconium silicate oxide.

The material of the bottom barrier layer includes metal nitride, and the metal nitride forming the bottom barrier layer includes titanium nitride or tantalum nitride.

The material of the top barrier layer is TiN or a superposition layer of TiN and Ti.

The material of the metal grid is tungsten (W).

The FinFET device includes a fin body 103, the source region and the drain region are formed in the fin body 103 on the two sides of the gate structure, and the gate structure covers a top surface and two side surfaces of the fin body 103 between the source region and the drain region. The fin body 103 is formed after etching the semiconductor substrate. The fin body 103 will protrude on the surface of the semiconductor substrate after etching. FIG. 1 is a sectional structural view along the fin body 103, so the fin body 103 and the semiconductor substrate at the bottom are in an integrated structure.

FIG. 1 shows two types of FinFETs, i.e., N-type FinFET and P-type FinFET. The gate structure of the N-type FinFET is as shown in the dotted box 105a, and the gate structure of the P-type FinFET is as shown in the dotted box 105b. The major difference between the gate structure of the N-type FinFET and the gate structure of the P-type FinFET is their different work function layers: the work function layer of the N-type FinFET is an N-type work function layer 203, and the N-type work function layer 203 is usually TiAl; the work function layer of the P-type FinFET is a P-type work function layer 202, and the P-type work function layer 202 is usually TiN. Because the N-type FinFET and the P-type FinFET are fabricated together as an integral body, when the work function layer of the gate structure is fabricated, the P-type work function layer 202 is usually formed on the semiconductor substrate first; then the P-type work function layer 202 in the forming region of the N-type FinFET is removed; then the N-type work function layer 203 is formed on the semiconductor substrate, so actually the N-type FinFET 203 is formed on the surface of the P-type work function layer 202 in the gate structure of the P-type FinFET; the N-type work function layer 203 is formed only in the gate structure of the N-type FinFET. The top barrier layer is located on the surface of the N-type work function layer 203.

A back-end-of-line (BEOL) process layer is formed on the top of the middle-end-of-line process layer 102, the back-end-of-line process layer includes a plurality of metal layers and a plurality of interlayer films, and the first metal layer is formed on the surface of the first interlayer film 113 and is connected with the metal zeroth layer. In embodiment 1 of the present application, the metal zeroth layer connected with the capacitor and the resistor is a metal zeroth main layer 114a, and the metal zeroth layer connected with an active region is an MOA layer 114b. Both the MOP and MOA are longitudinal connection structures, and the MOP and MOA can reach a smaller size than contact's size.

From FIG. 1, it can be seen that a field oxide 104 is formed on the fin body 103, and the field oxide 104 is usually a shallow trench isolation (STI) oxide layer.

The FinFET usually further includes an embedded epitaxial layer which changes the stress in a channel region, and the channel region is located between the source region and the drain region and is covered by the gate structure. For the N-type FinFET, the embedded epitaxial layer is usually an embedded SiP epitaxial layer 106; for the P-type FinFET, the embedded epitaxial layer is usually an embedded SiGe epitaxial layer 107.

Different from the current technique in which the capacitor is provided in the back-end-of-line process layer and the resistor is provided in the middle-end-of-line process layer, the embodiment 1 of the present application integrates both the capacitor integrated in the FinFET and the resistor into the middle-end-of-line process layer 102, and configures the double-layer structure of the resistor, i.e., the resistor main body layer 110b and the resistor covering layer 111b, and the bottom double-layer structure of the capacitor, i.e., the lower electrode plate 110*a* and the middle dielectric layer 111*a*, to be the same, such that the bottom double-layer structure of the capacitor and the double-layer structure of the resistor can be defined by adopting the same photomask and can be formed by adopting the same etching process, so embodiment 1 of the present application can save the photomask once, thus reducing the process cost and improving the process efficiency.

In addition, the capacitor in the embodiment 1 of the present application is placed in the middle-end-of-line process layer, and is conducive to the connection of the metal zeroth main layer of the metal zeroth layer of the middle-end-of-line process layer to realize the leading-out of the electrode, which is conducive to increasing the capacitance value and changing the capacitance value easily when the technical node is reduced, so as to realize a variable capacitor. For example, the capacitance value can be changed by adjusting the thickness of the second dielectric layer 111, and the capacitance value can be increased by increasing the thickness of the second dielectric layer 111.

Figure 2:
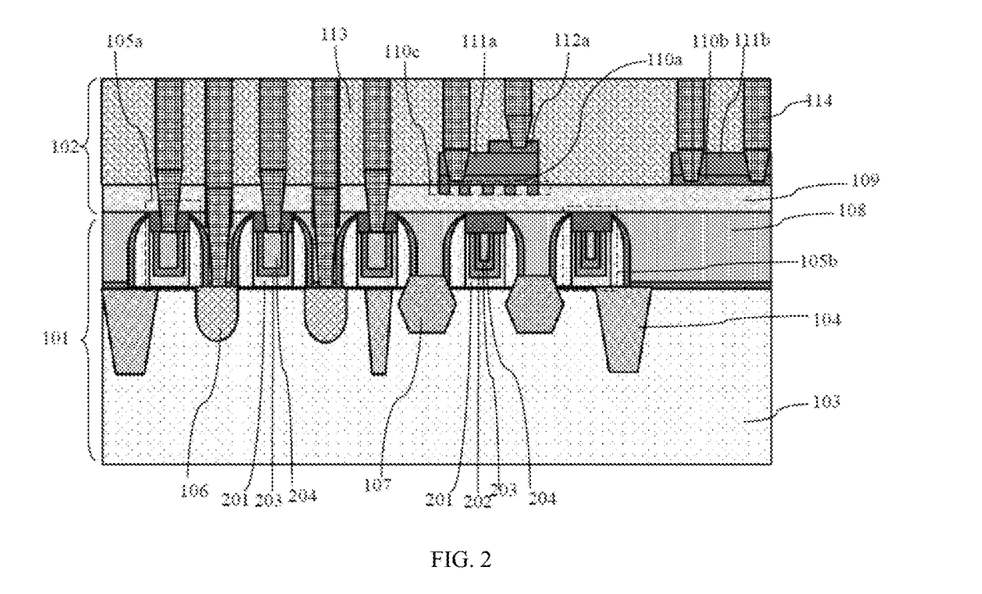
FIG. 2 is a schematic structural view of a capacitor integrated in the FinFET device according to embodiment 2 of the present application.

Referring to FIG. 2, it is a schematic structural view of a capacitor integrated in a FinFET according to embodiment 2 of the present application. A difference between the FinFET according to embodiment 2 of the present application and the FinFET according to embodiment 1 of the present application is that the FinFET according to embodiment 2 of the present application has the following characteristics:

The interface layer, between the bottom surface of the lower electrode plate 110*a*, and the top surface of the first oxide layer 109, includes a patterned region, so the effective contact area of the lower electrode plate 110*a* with the first oxide layer is enlarged and can be set to different levels by varying the etched pattern depth in the first oxide layer 109, and thereby the capacitance value of the capacitor can be preset with flexibility.

Figure 3A:
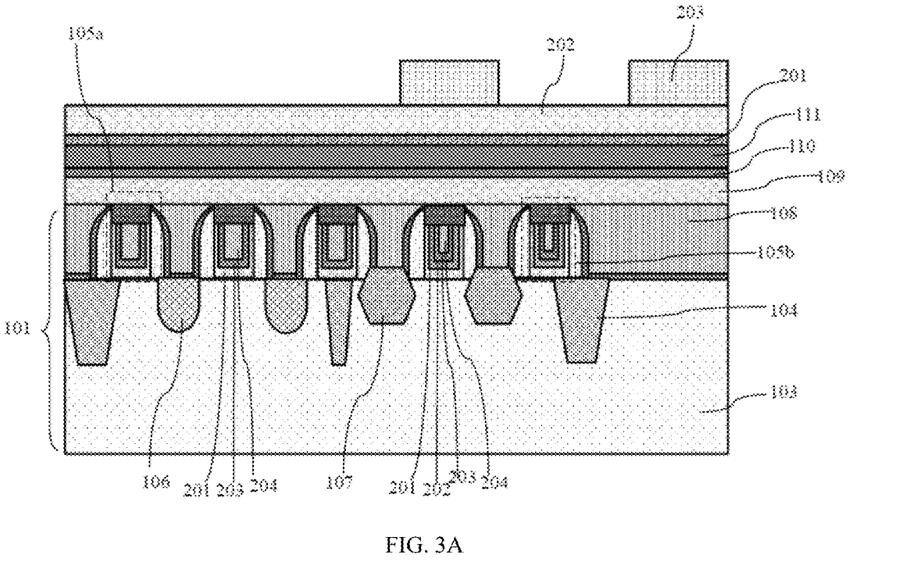
FIG. 3A to FIG. 3E are schematic structural views of the capacitor integrated in the FinFET device according following each step of the method during fabricating it according to another embodiment of the present application.

FIGS. 3A to 3E are schematic structural views of the capacitor integrated in the FinFET device following each step in the fabrication method according to one embodiment of the present application. The method for fabricating the capacitor integrated in the FinFET disclosed by the present application includes the following steps:

In step 1, referring to FIG. 3A, a semiconductor substrate comprising a stack of layers from the front-end-of-line process is provided, a front-end-of-line process layer 101 includes a FinFET device, the FinFET device includes gate structures and a source region and a drain region formed on two sides of each of the gate structures. The front-end-of-line process layer 101 further includes a zeroth interlayer film 108 which fills between the gate structures, and herein the top surfaces of the gate structures are in flush with the top surface of the zeroth interlayer film 108.

In the method provided by the embodiment of the present application, the technology process node of the FinFET is 14 nm and beyond.

Each of the gate structure includes a gate dielectric layer 201, a work function layer and a metal gate 204.

The gate dielectric layer 201 includes a high-dielectric-constant material layer, an interface layer between the high-dielectric-constant layer and the surface of the semiconductor substrate, and a bottom barrier layer on the upper surface of the high-dielectric-constant layer.

A top barrier layer is further provided between the work function layer and the metal gate.

The material of the interface layer includes silicon oxide.

The material of the high-dielectric-constant layer includes one of silicon dioxide, silicon nitride, aluminum oxide, tantalum pentoxide, yttrium oxide, hafnium silicate oxide, hafnium dioxide, lanthanum oxide, zirconium oxide, strontium titanate, and zirconium silicate oxide.

The material of the bottom barrier layer includes metal nitride, and the metal nitride forming the bottom barrier layer includes titanium nitride or tantalum nitride.

The material of the top barrier layer is TiN or a superposition layer of TiN and Ti.

The material of the metal grid is W.

The FinFET devices are built on a fin body 103, the source region and the drain region are formed in the fin body 103 on the two sides of each of the gate structures, and the gate structures are disposed on the top surface between the source region and the drain region of the fin body 103. The fin body 103 is formed after patterning the semiconductor substrate. The fin body 103 protrudes from the top surface of the semiconductor substrate after etching. FIG. 1 is a cross sectional structural view along the fin body 103, so the fin body 103 is integrated into the semiconductor substrate.

FIG. 3A shows two types of FinFET devices, i.e., N-type FinFET and P-type FinFET. The gate structure of the N-type FinFET is shown in the dotted box 105*a*, and the gate structure of the P-type FinFET is as shown in the dotted box 105*b*. The difference between the gate structure of the N-type FinFET and the gate structure of the P-type FinFET is in the work function layers. The work function layer of the N-type FinFET is an N-type work function layer 203, and the N-type work function layer 203 is usually made of TiAl. The work function layer of the P-type FinFET is a P-type work function layer 202, and the P-type work function layer 202 is usually made of TiN. Because the N-type FinFET and the P-type FinFET devices are fabricated at the same steps as an integrated body, when the work function layers of the gate structures are fabricated, the P-type work function layer 202 is usually formed on the semiconductor substrate first, followed by removing the P-type work function layer 202 from where the N-type FinFET is going to be formed, then the N-type work function layer 203 is formed on surface of the semiconductor substrate, such that the N-type FinFET 203 is formed on the surface of the P-type work function layer 202 of the gate structure of the P-type FinFET. The N-type work function layer 203 is formed only in the gate structure of the N-type FinFET. The top barrier layer of the N-type FinFET is located on the surface of the N-type work function layer 203.

A field oxide structure 104 is formed in the fin body 103, and the field oxide structure 104 often includes a shallow trench isolation (STI) structure.

The FinFET further includes an embedded epitaxial layer to change the stress in a channel region, located between the source region and the drain region under the gate structure. For the N-type FinFET, the embedded epitaxial layer usually contains an embedded SiP epitaxial layer 106; for the P-type FinFET, the embedded epitaxial layer usually contains an embedded SiGe epitaxial layer 107.

In step 2, referring to FIG. 3A and FIG. 1, a middle-end-of-line process is performed and a capacitor and a resistor are formed in the middle-end-of-line process layer 102. The middle-end-of-line process includes the following sub-steps:

In step 2-1, a first oxide layer 109 is disposed on the outer surfaces of the gate structures and the zeroth interlayer film 108.

In step 2-2, a first TiN layer 110 and a second dielectric layer 111 are sequentially disposed on the surface of the first oxide layer 109.

In step 2-3, photolithography applies a first photomask to form a first photoresist mask 203. The first photoresist mask 203 covers the forming regions of the capacitor and the resistor, and opens the other regions besides those for the capacitor and the resistor.

In the method provided by the embodiment of the present application, before the first photoresist is patterned, a buffer oxide layer 201 is formed first, and then a first bottom anti-reflection coating (BARC) 202 is disposed on the surface of the buffer oxide layer 201, then the photoresist is disposed, followed by lithographic exposure and resist development to pattern the first photoresist mask 203.

Figure 3B:
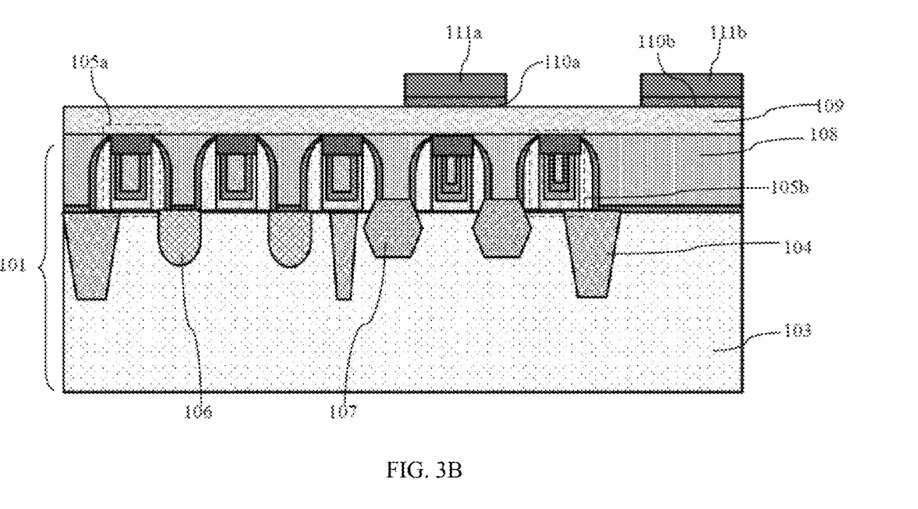

In step 2-4, referring to FIG. 3B, the second dielectric layer 111 and the first TiN layer 110 are sequentially etched.

In the method provided by the embodiment of the present application, the specific implementation mode of etching the second dielectric layer 111 and the first TiN layer 110 is as follows: by using the first photoresist mask 203 as a mask, the first bottom anti-reflection coating 202, the buffer oxide layer 201, the second dielectric layer 111 and the first TiN layer 110 outside the masked area of the first photoresist mask 203 are etched; as the result, the remaining buffer oxide layer 201, the first bottom anti-reflection coating 202 and the first photoresist mask 203 are removed.

In the forming region of the capacitor, the patterned first TiN layer 110 forms a lower electrode plate 110a and the patterned second dielectric layer 111 forms an intermediate dielectric layer 111a; in the forming region of the resistor, the patterned first TiN layer 110 forms a resistor main body layer 110b and the patterned second dielectric layer 111 forms a resistor cover layer 111b.

Figure 3C:
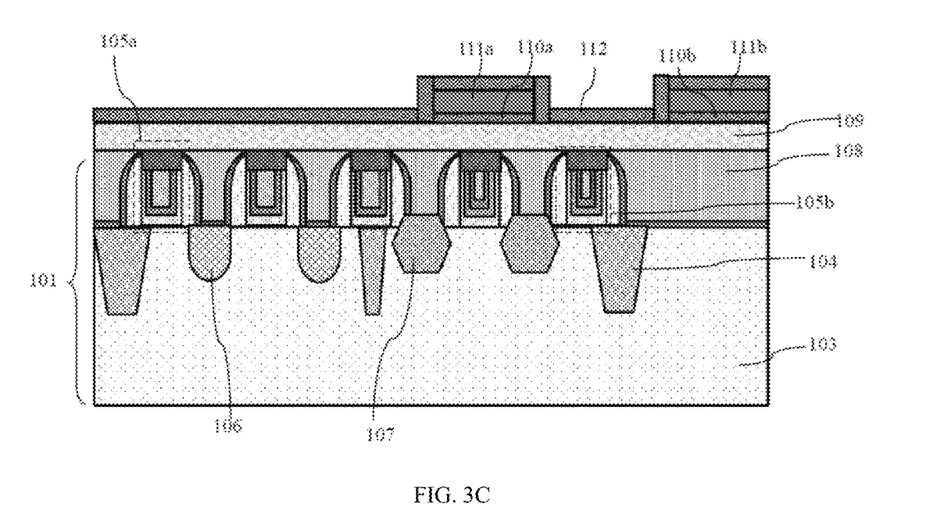

In step 2-5, referring to FIG. 3C, a second TiN layer 112 is formed between the capacitors and resistors.

Figure 3D:
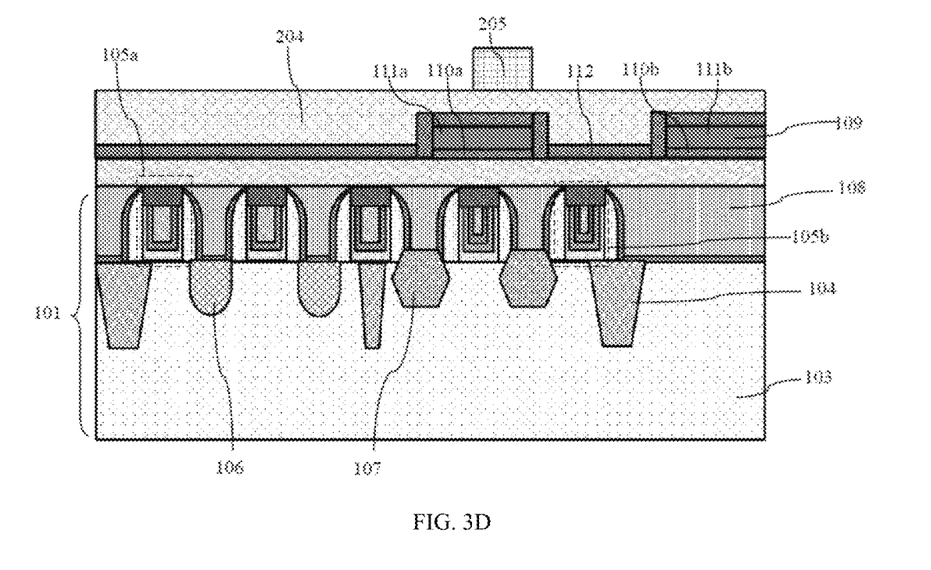

In step 2-6, referring to FIG. 3D and FIG. 1, another photolithographic process applying the second photomask is performed to pattern a second photoresist mask 205. The second photoresist mask is disposed on the forming region of the upper electrode plate 112a of the capacitor, and it opens the rest of the regions besides above the upper electrode plate 112a.

In the method provided by the embodiment of the present application, before the second photoresist mask 205 is formed, a second bottom anti-reflection coating 204 is disposed first, then the photoresist is spun on, followed by patterning the second mask 205 by photolithographic exposure and resist development.

Figure 3E:
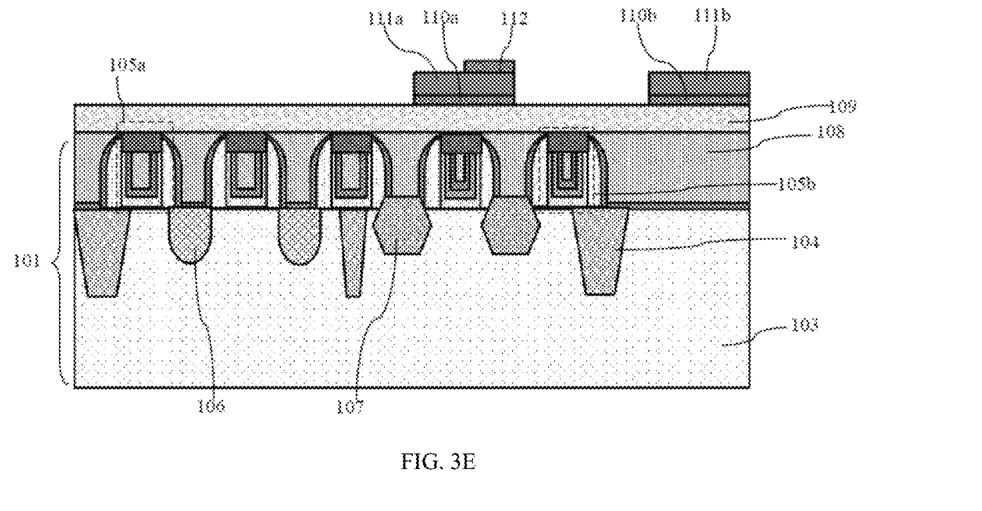

In step 2-7, referring to FIG. 3E, the upper electrode plate 112a is patterned from the second TiN layer 112, wherein the area of the upper electrode plate 112a is configured to be smaller than the area of the lower electrode plate 110a.

According to the method provided by the embodiment of the present application, the specific implementation mode of patterning the second TiN layer 112 is as follows: by using the second photoresist mask 205 as a mask, the second bottom anti-reflection coating 205 and the second TiN layer 112 outside the covered area of the second mask 205 are removed; then the remaining second bottom anti-reflection coating 205 and the second mask 205 are also removed.

In step 2-8, referring to FIG. 1, a first interlayer film 113 is formed; the first interlayer film 113 is disposed on the surface of the first oxide layer 109 to form the capacitor and the resistor.

In step 2-9, a metal zeroth layer is patterned in the first interlayer film 113; two ends of the capacitor, i.e. the lower electrode plate 110a and the upper electrode plate 112a, and the resistor main body layer 110b are respectively connected to the column-like metal zeroth main layer 114a of the metal zeroth layer.

After the middle-end-of-line process in step 2 is completed, the disclosed method further includes performing a back-end-of-line process to form a back-end-of-line process layer, the back-end-of-line process layer includes a plurality of metal layers and a plurality of interlayer films, and the first metal layer is formed on the surface of the first interlayer film 113 and is interconnected with the metal zeroth layer. In the method provided by the embodiment of the present application, the metal zeroth layer connected with the capacitor and the resistor is a metal zeroth main layer 114a, and the metal zeroth layer connected with an active region is an metal zero A (MOA) layer 114b.

The order of magnitude of the capacitance value of the capacitor is in pF.

The resistor a high resistance resistor (Hi-R).

The method provided by the embodiment of the present application can realize the capacitor integrated with the FinFET according to embodiment 1 of the present application shown in FIG. 1, wherein the capacitor can have a flexible design-defined value. A method for forming the flexible capacitance value can be realized by adjusting the deposition thickness of the second dielectric layer 111 in step 2-2.

The method provided by the embodiment of the present application can also fabricate a capacitor which is integrated with the FinFET according to embodiment 2 of the present application shown in FIG. 2, and achieve a flexible capacitor having capacitance defined by process design. A method for forming the flexible capacitor is as follows: after step 2-1 and before the first TiN layer 110 is formed, the method further includes a step of patterning the surface of the first oxide layer 109, to increase the effective contact area of the lower electrode plate 110a with the intermediate dielectric layer 111a by changing the etched depth of the first oxide layer 109.

The present application has been described in detail through the specific embodiments, but these embodiments do not constitute limitations to the present application. Without departing from the principle of the present application, various deformation and improvements may be made by those skilled in the art, which shall also be regarded as the scope of protection the present application.

What is claimed is:

1. A method for fabricating a capacitor integrated in a FinFET device, wherein the method comprises following steps:
   step 1: providing a semiconductor substrate which has completed a front-end-of-line process, wherein a layer formed in the front-end-of-line process comprises the FinFET device, wherein the FinFET device comprises gate structures, source regions and drain regions placed on two sides of the gate structures, wherein the layer formed in the front-end-of-line process further comprises a zeroth interlayer film filled between the gate structures, wherein top surfaces of the gate structures are in flush with a surface of the zeroth interlayer film; and
   step 2: performing a middle-end-of-line process and forming a capacitor and a resistor in the middle-end-of-line process layer;
   wherein the middle-end-of-line process comprises following sub-steps:
   step 2-1: forming a first oxide layer on top surfaces of the gate structures and the zeroth interlayer film;
   step 2-2: forming a first TiN layer and a second dielectric layer sequentially on the surface of the first oxide layer;

step 2-3: performing photolithography with a first photomask to form a first photoresist mask, wherein the first photoresist mask covers forming regions of the capacitor and the resistor and keeps remaining regions besides the forming regions of the capacitor and the resistor open;

step 2-4: etching the second dielectric layer and the first TiN layer sequentially; wherein after the etching, the first TiN layer becomes a lower electrode plate and the second dielectric layer forms an intermediate dielectric layer of the capacitor in the forming region of the capacitor, and the first TiN layer forms a resistor main body layer and the second dielectric layer forms a resistor cover layer in the forming region of the resistor;

step 2-5: forming a second TiN layer;

step 2-6: performing photolithography with a second photomask to form a second photoresist mask, wherein the second photoresist mask covers a forming region of the upper electrode plate of the capacitor and keeps remaining regions besides a forming region of the upper electrode plate open;

step 2-7: etching the second TiN layer to form the upper electrode plate, wherein an area of the upper electrode plate is configured to be smaller than an area of the lower electrode plate;

step 2-8: forming a first interlayer film, wherein the first interlayer film is disposed on the surface of the first oxide layer which is under the capacitor and the resistor; and step 2-9: patterning a metal zeroth layer in the first interlayer film, wherein the lower electrode plate, the upper electrode plate and the resistor main body layer are respectively connected with a metal zeroth main layer of the metal zeroth layer.

2. The method for fabricating the capacitor integrated in the FinFET device according to claim 1, wherein a technology process node of the FinFET device is 14 nm and beyond.

3. The method for fabricating the capacitor integrated in the FinFET device according to claim 1, wherein the first oxide layer comprises silicon oxide disposed by a plasma enhanced chemical vapor deposition process.

4. The method for fabricating the capacitor integrated in the FinFET device according to claim 1, wherein the second dielectric layer comprises silicon nitride.

5. The method for fabricating the capacitor integrated in the FinFET device according to claim 2, wherein an order of magnitude of a capacitance value of the capacitor is in pF.

6. The method for fabricating the capacitor integrated in the FinFET device according to claim 1, wherein each one of the gate structures comprises a gate dielectric layer, a work function layer and a metal gate, and wherein the gate dielectric layer comprises a high-dielectric-constant material.

7. The method for fabricating the capacitor integrated in the FinFET device according to claim 6, wherein the FinFET device comprises a fin body, wherein one of the source regions and one of the drain regions are formed in the fin body on the two sides of one of the gate structures, and wherein said gate structure is disposed between said source region and said drain region on a top surface and two side surfaces of the fin body.

8. The method for fabricating the capacitor integrated in the FinFET device according to claim 2, wherein in step 2-2, a capacitance value of the capacitor is flexibly set by forming a predetermined thickness of the second dielectric layer.

9. The method for fabricating the capacitor integrated in the FinFET device according to claim 2, wherein after step 2-1 and before forming the first TiN layer, the method further comprises a step of etching the surface of the first oxide layer, wherein an effective contact area of the lower electrode plate is changed by varying an etching depth on the first oxide layer, and wherein the effective contact area changes the capacitance value of the capacitor.

\* \* \* \* \*